United States Patent [19]

Predina

[11] 4,313,089

[45] Jan. 26, 1982

[54] PRECISION QUADRATURE ANALOG PHASE DETECTOR

[75] Inventor: Joseph P. Predina, Streamwood, Ill.

[73] Assignee: Motorola, Inc., Schaumburg, Ill.

[21] Appl. No.: 136,011

[22] Filed: Mar. 31, 1980

[51] Int. Cl.³ .............................................. H03C 3/00
[52] U.S. Cl. ..................................... 328/155; 307/512
[58] Field of Search ................ 328/155, 166; 307/511, 307/512, 513

[56] References Cited

U.S. PATENT DOCUMENTS

| | | | |
|---|---|---|---|
| 3,514,720 | 3/1967 | Roucache et al. | 332/43 |
| 3,688,196 | 8/1972 | Doelz | 328/166 |
| 3,771,063 | 11/1973 | Barrett | 328/134 |
| 3,803,499 | 4/1974 | Malik | 328/155 |
| 3,961,172 | 6/1976 | Hutcheon | 235/181 |
| 3,961,281 | 6/1976 | Woodling, Jr. | 330/129 |

*Primary Examiner*—David K. Moore
*Attorney, Agent, or Firm*—Donald P. Reynolds; Edward M. Roney; James W. Gillman

[57] ABSTRACT

A precision quadrature analog phase detector provides a controllable amount of amplification of a signal that is then applied to a double balanced mixer for comparison with a reference signal. Outputs of the mixer are attenuated an amount equal in proportion to the amount of amplification to provide a constant overall gain. The double balanced mixer thus receives signals at a relatively high and substantially constant level regardless of the level of the input. Means are also provided for controlling offset.

6 Claims, 5 Drawing Figures

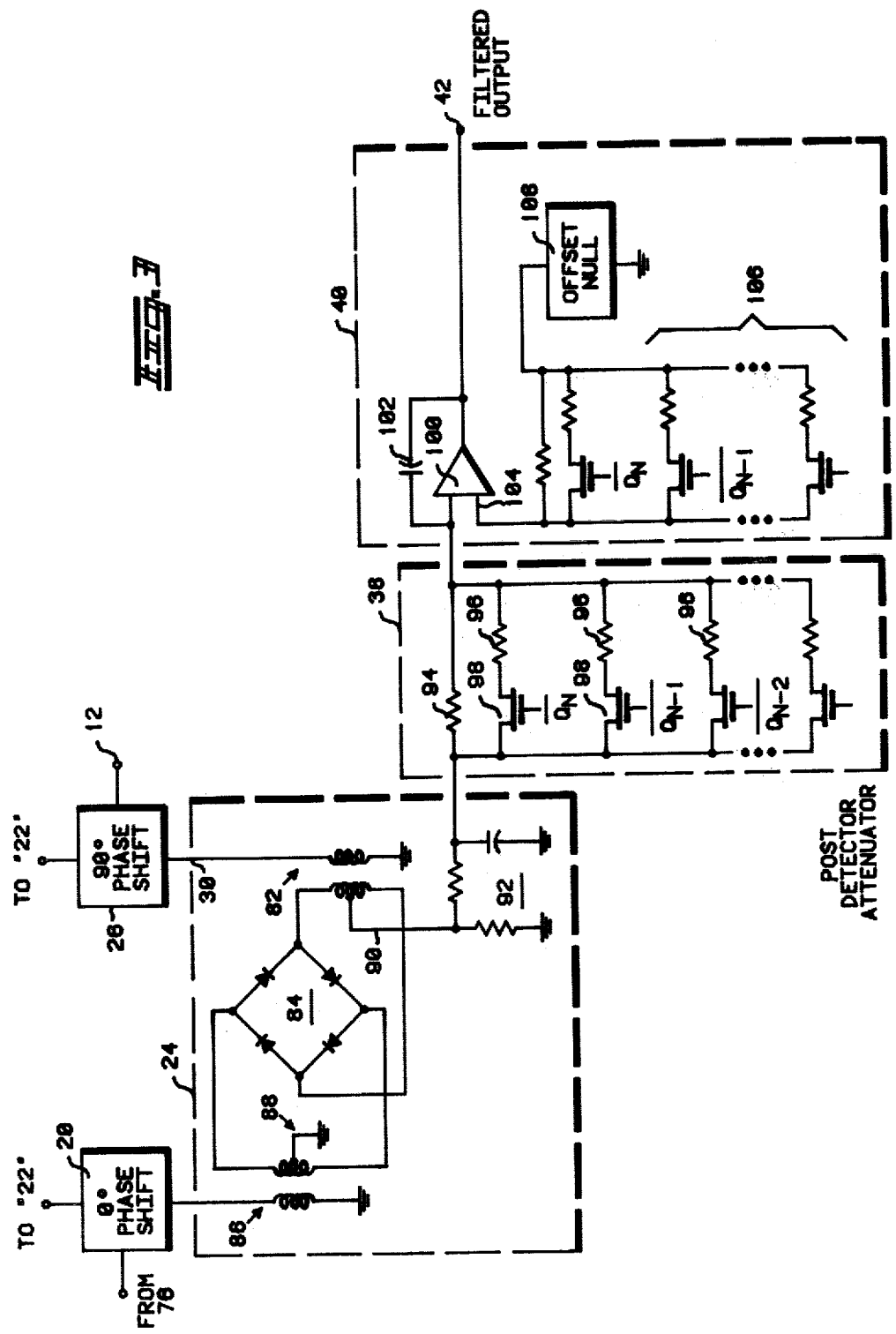

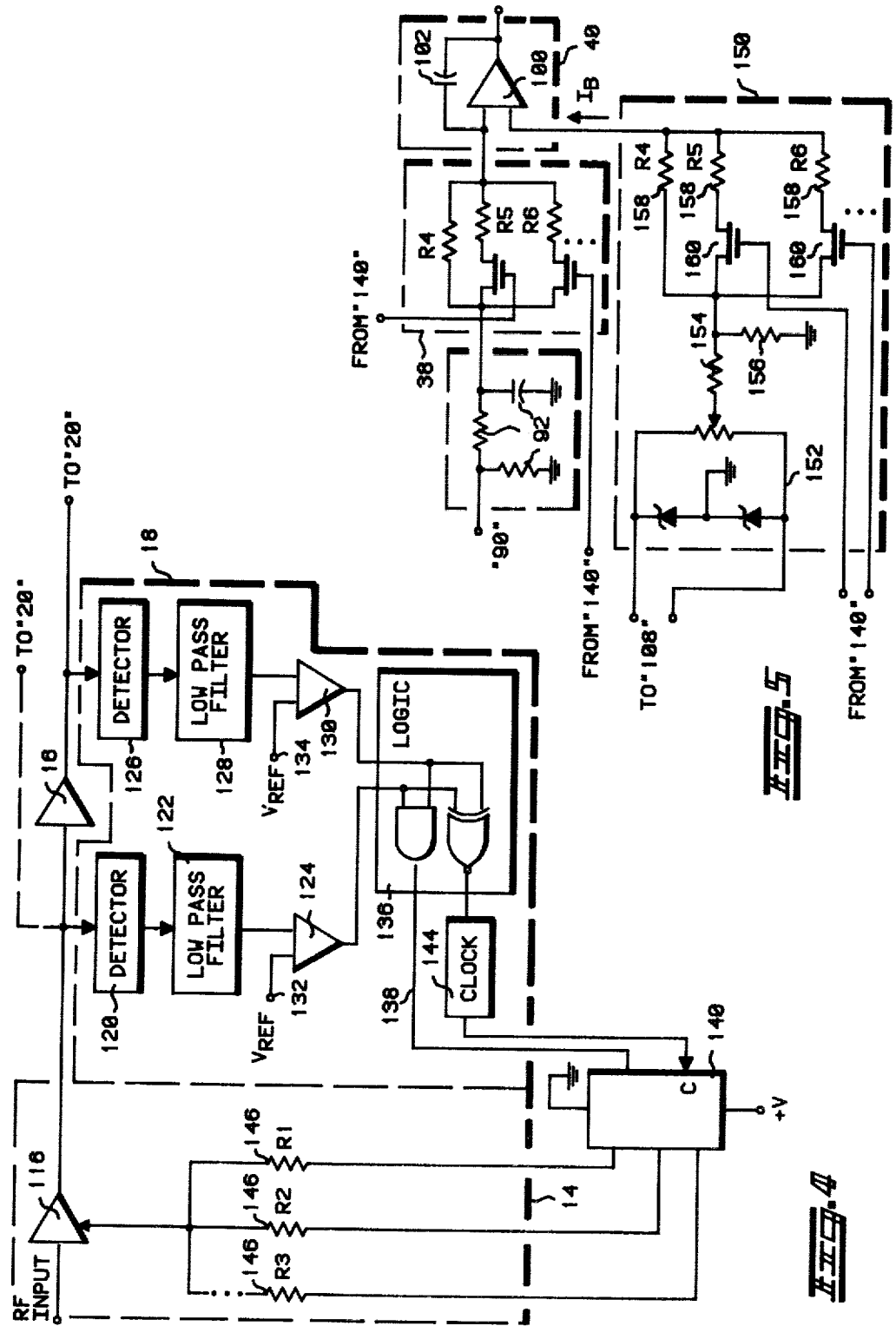

PRECISION QUADRATURE ANALOG PHASE DETECTOR

BACKGROUND OF THE INVENTION

This invention relates to a phase detector for electrical signals. In particular, it is a quadrature phase detector that has a small phase error over a large range of input signals with a constant phase-detector gain over that range.

A phase detector is an electrical circuit that produces a DC signal that provides a measure of the difference in phase between two input signals. Phase detectors are used in such electrical systems or items of equipment as phase-locked loops, analog correlators, adaptive filters, and clock recovery in digital systems, among others. Conventional phase detectors often exhibit inaccuracies over part or all of the range of variation due to circuit component tolerances. One means of minimizing these effects in past phase detectors has been to use precision temperature-compensated components. This increases the cost over that of a phase detector using conventional components. Another way of minimizing the effects of inaccuracies is to increase gain to make the detector output larger with respect to the inaccuracies. This often results in a detector gain which varies as a function of amplitude. This is undesirable when the phase detector is part of a control loop.

It is an object of the present invention to provide a better phase detector.

It is a further object of the present invention to provide a precision quadrature phase detector exhibiting a constant gain.

It is a further object of the present invention to provide precision quadrature phase detector having controllable offset voltages.

Other objects will become apparent in the course of a detailed description of the invention.

SUMMARY OF THE INVENTION

A precision quadrature constant-gain phase detector has at its input a step attenuator in cascade with an amplifier. The step attenuator is controlled in response to a feedback signal to maintain a constant signal level at the output of the amplifier. The amplified signal is applied to a quadrature phase detector that produces two outputs. Both outputs are then applied to step attenuators that are controlled to maintain a functional relation with the input gain so that the overall gain is constant. The control is also applied to compensate any offset voltage appearing at the phase detector output. In an alternate embodiment the step attenuator is replaced by an AGC amplifier for which the gain is controlled in steps.

BRIEF DESCRIPTION OF THE DRAWINGS

FIG. 3 is a circuit diagram of one of the mixers and associated circuitry of FIG. 1.

FIG. 4 is a circuit diagram of an alternate embodiment of the input section of FIG. 1.

FIG. 5 is a circuit diagram of an alternate embodiment of the output section of FIG. 1.

DETAILED DESCRIPTION OF THE INVENTION

Figure 1:
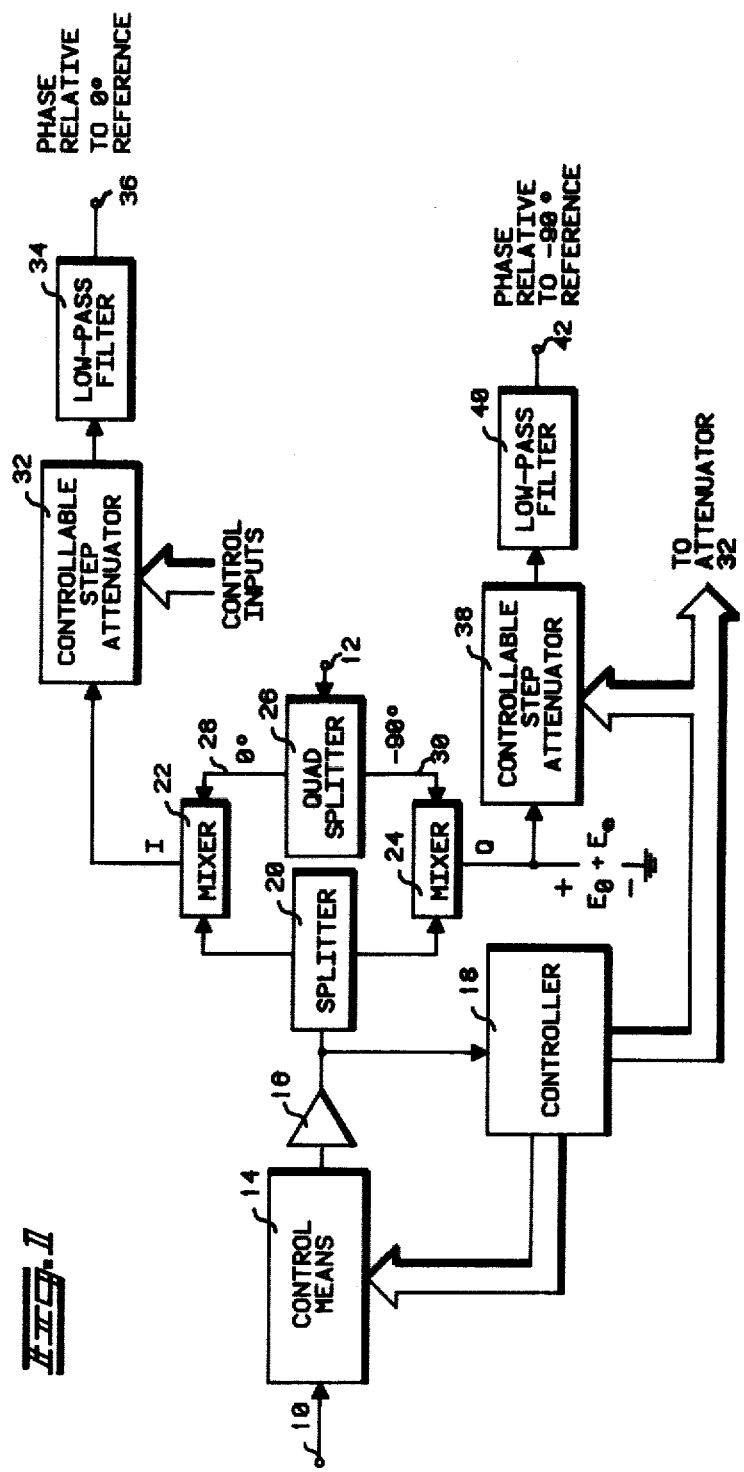
FIG. 1 is an overall block diagram of the precision quadrature constant-gain phase detector of the present invention.

FIG. 1 is an overall block diagram of an apparatus for the practice of the present invention. In FIG. 1 terminal 10 receives a signal, the phase of which is to be compared to the phase of a reference signal that is applied at terminal 12. The signal at terminal 10 is applied to a controllable gain means 14, then to an amplifier 16. The output of amplifier 16 is connected to controller 18 which, in turn, is connected to controllable gain means 14 to provide a constant value of signal at the output of amplifier 16 regardless of variations in signal level at terminal 10. The output from amplifier 16 is taken to splitter 20 which provides two signals, equal in amplitude and both in phase with the signal at terminal 10. The two signals are coupled to mixers 22 and 24, respectively. The reference signal at terminal 12 is applied to a quadrature splitter 26 that provides an in-phase reference on line 28 and a quadrature reference, 90 degrees out of phase with the signal at terminal 28, on line 30. Mixer 22 compares the signal from splitter 20 with the in-phase reference on line 28, and the quadrature mixer 24 compares the in-phase signal on line 20 with the quadrature reference on line 30.

The output signals from mixers 22 and 24 are taken to identical circuits for identical treatment. The output of mixer 22 is connected to step attenuator 32 which is controlled from controller 18 to produce an attenuation equal to the gain of the combination of controllable gain means 14 and amplifier 16. The output step attenuator 32 is connected to low-pass filter 34 which produces at output terminal 36 an electrical signal which varies in proportion to the phase difference between the two signals that are inputs to the mixer 22. In a similar fashion, step attenuator 38 receives the output of mixer 24 which compares the input signal with the shifted reference signal from splitter 26. Step attenuator 38 is also controlled from controller 18 to insert an attenuation equal to the gain of the combination of controllable gain means 14 and amplifier 16. The output of step attenuator 37 is connected to low-pass filter 40 to produce at terminal 42 an electrical signal that is proportional to the difference in phase between the input signal at terminal 10 and a signal that is 90 degrees out of phase with the reference signal at terminal 12.

Figure 2:
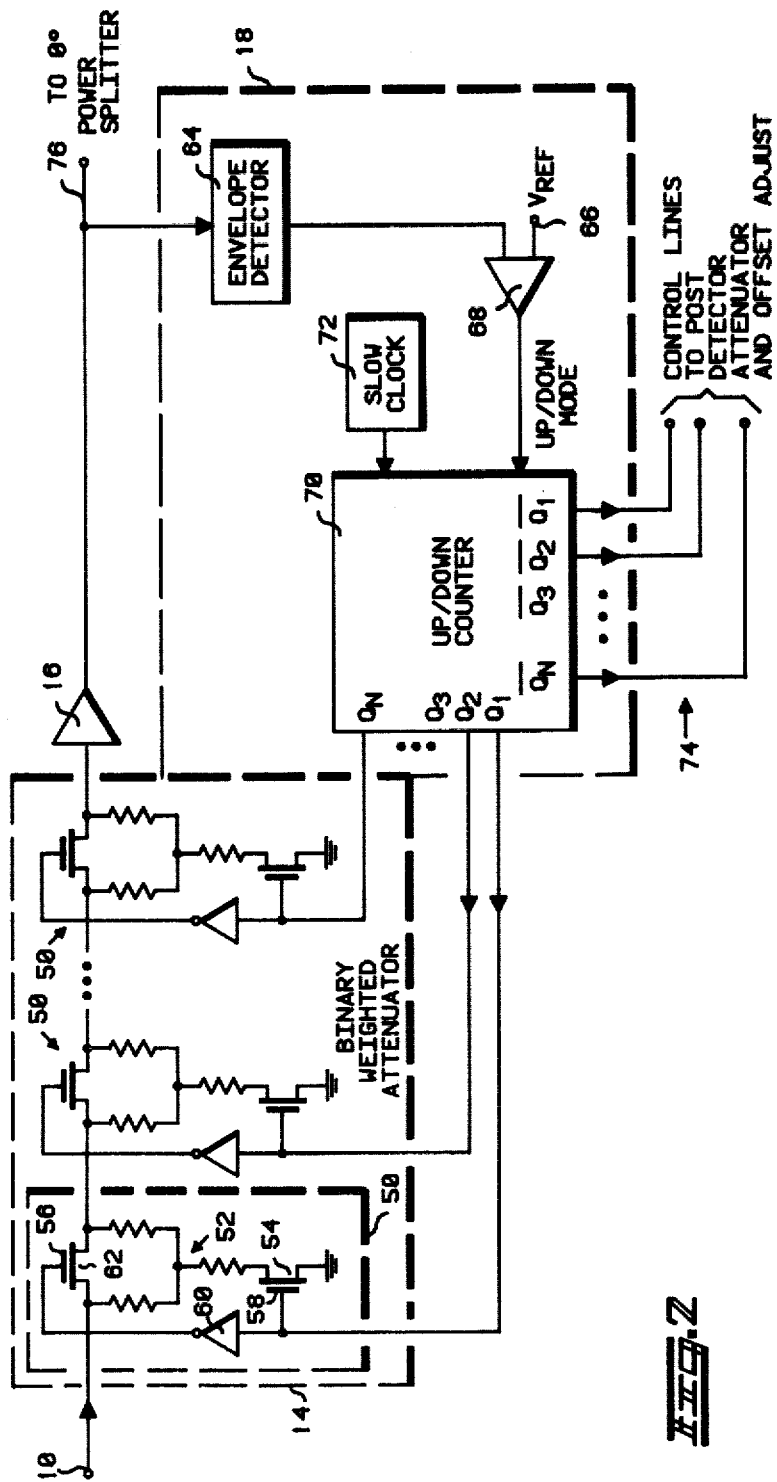
FIG. 2 is a detailed circuit diagram of the input section of FIG. 1.

FIG. 2 is a detailed representation of the portion of FIG. 1 that includes controllable gain means 14, amplifier 16 and controller 18. In FIG. 2 terminal 10 receives an input signal that is conducted to the first of a plurality of switchable attenuation elements 50. Each attenuation element 50 comprises a resistive pad 52 that is connected to ground through a field-effect transistor (FET) 54, and that is by-passed by an FET 56. Both FETs 54 and 56 are controlled by controller 18 so that one or the other, but not both, is substantially shorted. To accomplish this, the signal from controller 18 that is connected to gate 58 of FET 54 is applied to inverter 60 before it is connected to gate 62 of FET 56. When FET 54 is caused to be a short circuit by a signal from controller 18, FET 56 will be an open circuit and pad 52 will be inserted to attenuate the input signal at terminal 10. Resistor values in pad 52 are selected to provide a desired amount of attenuation such as 10 db. When the input signal is reversed, FET 54 will be opencircuited, FET 56 will be a short circuit and pad 52 will be removed from the circuit. The cascaded sequence of attenuation elements 50 can thus be selected as desired to provide any given number of elements of attenuation in the circuit.

The output of controllable gain means 14 is taken to an amplifier 16 which has a fixed gain. The output of amplifier 16 is connected to controller 18 which comprises an envelope detector 64 that produces a signal proportional to the amplitude of the output signal from amplifier 16. The output of envelope detector 64 is compared with a reference voltage 66 in a comparator 68, and the output of comparator 68 drives an up/down counter 70 that is clocked by clock 72. When there is no output from comparator 68, counter 70 does not count and the state of attenuation elements 50 in controllable gain means 14 remains unchanged. A positive or negative signal from comparator 68 causes up/down counter 70 to count up or down accordingly and to generate output signals to different attenuation elements 50 to restore the zero output from comparator 68. The outputs from up/down counter 70 of the first polarity are taken to the attenuation elements 50 of FIG. 2, and the outputs from up/down counter 70 of the opposite polarity are taken on control lines 74 for later use. By means of the circuitry just described, the output of amplifier 16 has been subjected to feedback control to set it at a constant level at line 76 to the degree of smallest resolution allowed by the controllable gain means 14. That level can be set at any desired value by adjusting the value of reference voltage 66.

FIG. 3 is a diagram of a circuit that continues the processing of the signal on line 76 of FIG. 2. In FIG. 3 line 76 is connected to a splitter 20 which develops two signals that are equal in amplitude to each other and that are in phase with the input signal at terminal 10 of FIG. 1. One output from splitter 20 is connected to mixer 22 of FIG. 1, and the other is connected to mixer 24. As these are identical, only mixer 24 is shown here. Similarly, the reference signal at terminal 12 is taken to a quadrature splitter 26 to generate an in-phase signal on line 28 that is connected to mixer 22. A quadrature signal on line 30 is caused by splitter 26 to be 90 degrees out of phase with the in-phase signal on terminal 28. Line 30 is connected to transformer 82 to form one input to diode bridge 84. The output of splitter 20 is connected to transformer 86 to provide the other input to diode bridge 84. Transformers 82 and 86 and diode bridge 84 form a conventional double balanced mixer. A centertapped secondary of transformer 86 is connected by line 88 to ground, and the centertapped secondary of transformer 82 produces the detected output signal on line 90 as a voltage with respect to ground. The output voltage on line 90 has or may have two undesirable features. It has a component at twice the frequency of the reference voltage on terminal 12, and it may have an excessive DC offset voltage. The offset voltage here has two parts. One is a constant error voltage originating from the mixer due to diode and transformer imbalances there. The other is an error voltage at the input to amplifier 100 resulting from input loading and imbalances in that amplifier. The latter component may vary as different values of resistance are connected at the input to the amplifier. While the offset voltage is reduced in its effect by amplifying the low-level signals that enter at terminal 10, there may still be an undesirable amount of offset in the voltage on terminal 90. These two possible disadvantages are dealt with as follows.

Low-pass filter 92 is chosen to pass low-frequency components of the signal that enters on terminals 10 and 12 while suppressing double-frequency components that are introduced by the mixer. This removes one undesirable feature. The offset continues on the filtered signal which enters step attenuator 38. Step attenuator 38 includes a series resistor 94 shunted by a plurality of resistors 96, each of which is switched by an FET 98. Each FET 98 is switched by a signal from controller 18 so that the change in attenuation of step attenuator 38 is selected to be equal to the change in gain of controllable gain means 14 and amplifier 16. This has allowed the operation of the double balanced mixer 24 to be optimized in that double balanced mixer 24 receives a signal at a substantially constant and high level.

The output of step attenuator 38 is taken to low-pass filter 40 to produce a filtered output at terminal 42. For some purposes, a passive low-pass filter would suffice as low-pass filter 40. FIG. 3 shows the filter realized by a precision operational amplifier 100 connected as an integrator through the use of capacitor 102 and the resistances to ground represented by step attenuator 38 and low-pass filter 92. With operational amplifier 100 in use, it is possible to add a voltage at terminal 104 to null the combined offset voltage of terminal 90 and any op amp input offset voltage. This may be done by connecting a constant or adjustable DC voltage at terminal 104. Alternatively, terminal 104 may be supplied by a binary attenuation network which is identical to attenuation network 38. Offset null circuitry 108 provides a voltage to attenuator 106 such that the combined offset voltage on terminal 90 and that of the op amp is compensated. The matching attenuator networks 38 and 106 assure balance so that the offset null compensation is maintained irrespective of individual FET switch states and input loading to amplifier 100.

FIG. 4 is a circuit diagram of an alternate embodiment of the input portion of the circuit of FIG. 1. In FIG. 4 an automatic-gain-control (AGC) amplifier 116 receives as an input a signal the phase of which is to be compared to the phase of a reference signal. The output of AGC amplifier 116 is connected to an amplifier 16 that has a fixed gain, here 30 dB. The output of amplifier 16 is a gain-controlled signal that is taken to splitter 20 of FIG. 1. The output signal from AGC amplifier 116 is also applied to a detector 120, and the output of detector 120 is passed through a low-pass filter 122 to produce one input to comparator 124. In a similar fashion the output of amplifier 16 is taken to a detector 126 and the output of detector 126 is passed through low-pass filter 128, and thence to comparator 130.

Comparator 124 receives as a second input a fixed reference voltage from reference source 132, and comparator 130 receives as an input a fixed voltage from reference source 134. If the reference from source 132 equals the reference from source 134, then comparator 124 will detect a signal 30 dB smaller than the signal at comparator 130. Each of the reference sources 132 and 134 can be adjusted to control the value of the difference signal that appears as an output from each of the comparators 124 and 130. In a similar manner, changing the gain of amplifier 16 from 30 dB to some other value will also change the detection different. Output signals from comparators 124 and 130 are connected to logic unit 136. Logic unit 136 has two outputs. The first output 138 is connected to a shift register 140. The second output 142 is connected to a clock 144, the output of which is taken as a timing input to shift register 140. A plurality of outputs from shift register 140 are connected to a plurality of resistors 146 to select voltage levels to control the gain of AGC amplifier 116.

Referring again to logic unit 136, output 138 represents the logical product of the outputs of comparators 124 and 130 in that if both comparators 124 and 130 produce low signals, i.e. logical zeros, the signal on line 138 will cause a shift in shift register 140 to increase the gain of AGC amplifier 116. If the outputs of comparators 124 and 130 are both high, i.e. logical ones, then the signal on line 138 will cause shift register 140 to shift in the direction of reduced gain for AGC amplifier 116. If the output of comparator 124 is different from that of comparator 130, then the logic of logic unit 136 combines the two outputs in an exclusive NOR to disable clock 144 and prevent shift register 140 from changing the gain. In the preferred form of the circuit of FIG. 4 resistors 146 were chosen to provide changes of 20 dB in the gain of AGC amplifier 116. Amplifier 16 was selected to provide 30 dB of gain, and the voltages of reference sources 132 and 134 were equal causing detected level changes of 30 dB. With this combination it is evident that there is a gain hysteresis of 10 dB in which range the clock 144 will be disabled and the gain of AGC amplifier 116 will remain unchanged. These values are matters of choice at the option of the designer. The same or a similar circuit could have been used to provide hysteresis in the circuit of FIG. 2.

It should be evident that if AGC amplifier 116 provides enough gain to feed splitter 20, then an output to splitter 20 could be taken from the input to amplifier 16 of FIG. 4, as dotted. Amplifier 16 would then serve only to supply a measured gain for controller 18. This is equivalent to splitting the functions of amplifier 16 in two parallel parts, signal amplification and control, and setting the signal amplification to zero. This is clearly a matter of design choice.

FIG. 5 is an alternate embodiment of a circuit for controlling the output level from the mixer. In FIG. 5 the step attenuator 38 is like that shown in detail in FIG. 3 with switching of the FETs controlled by shift register 140 of FIG. 4. The low-pass filter 40 again contains an operational amplifier 100 with an integrating capacitor 102. In FIG. 5 the offset current in operational amplifier 100 is supplied by a circuit 150 in which a voltage-divider network 152 is connected through a resistor 154 and a resistor 156 that with resistor 154 comprises a further divider. The divided voltage is applied at one terminal of operational amplifier 100 after it is applied to a further network of resistors 158 and FETs 160. Each FET 160 is switched by a signal from shift register 140 of FIG. 4. There is a predetermined combination of resistors 158 in the circuit for each position of shift register 140 of FIG. 4 such that a gain change in amplifier 16 is compensated by an identical attentuation change in network 38. It should be apparent in referring to FIG. 5 that a corresponding circuit identical in design would be applied to the output of mixer 22 of FIG. 3 to make the same adjustments in the gain and in the offset voltage for the quadrature phase signal.

An examination of the circuits of the present invention shows that the input signal to the double balanced mixer has been raised to a high level regardless of the level of the input signal. This facilitates optimal operation of the double balanced mixer. At the same time, the amplification that has been applied to a signal to raise it to that high level is removed by the corresponding amount of attenuation on the signals that come out of the double balanced mixer. It should also be apparent that while the description of the circuit is cast in terms of an insertion loss in the output that matches the gain in the input to provide overall constant amplification, those figures could be changed to include an overall constant amount of gain or insertion loss in the circuit by simple changes in resistor values in the circuit so that the value of input gain differs from the output attenuation.

It should also be apparent to one skilled in the art that the FET switches used in the gain control means could be replaced by relays, reed switches, or the like to achieve the same purpose. The input RF attenuator could also use PIN diodes as RF switching elements.

I claim:

1. A precision quadrature phase detector for generating an output signal that provides a measure of a difference in phase between a test signal and a reference signal, the detector comprising:
   a. a level controller;
   b. gain-control means connected to the level controller for receiving the test signal and producing an amplified test signal at a level held substantially constant and relatively high by the level controller;
   c. an in-phase splitter connected to the gain-control means to produce a first and second split amplified test signal;
   d. a quadrature splitter receiving the reference signal and producing an in-phase reference component and a quadrature reference component;
   e. a first double balanced mixer connected to the in-phase splitter and the quadrature splitter, the first double balanced mixer receiving and mixing the first split amplified test signal and the in-phase reference component to produce an in-phase mixer output signal;
   f. a first controllable step attenuator connected to the level controller and to the first double balanced mixer to receive the in-phase mixer output signal and produce an attenuated in-phase mixer output signal at a level controlled by the level controller; and
   g. a first low-pass filter connected to the first controllable step attenuator to receive and filter the attenuated in-phase mixer output signal to produce the output signal, which output signal provides a measure of the difference in phase between the test signal and the reference signal.

2. The apparatus of claim 1 comprising in addition:
   a. a second double balanced mixer connected to both the in-phase splitter and the quadrature splitter, the second double balanced mixer receiving and mixing the second split amplified test signal and the quadrature reference component to produce a quadrature mixer output signal;
   b. a second controllable step attenuator connected to the level controller and to the quadrature balanced mixer to receive the quadrature mixer output signal and produce an attenuated quadrature mixer output signal at a level controlled by the level controller; and
   c. a second low-pass filter connected to the second controllable step attenuator to receive and filter the attenuated quadrature mixer output signal to produce a second output signal, which second output signal provides a measure of the difference in phase between the test signal and the reference signal.

3. The apparatus of claim 1 wherein the level controller comprises:

a. an envelope detector connected to the gain-control means to receive and detect the amplified test signal;

b. a comparator connected to the envelope detector to compare the detected signal with a reference and generate a counter control signal; and c. an up/down counter connected to the comparator to count up and down in response to the counter control signal, the up/down counter producing a plurality of outputs responsive to a count contained in the counter.

4. The apparatus of claim 3 wherein the gain-control means comprises:

a. a plurality of attenuation elements equal in number to the plurality of outputs of the up/down counter, all of the attenuation elements connected in cascade, and each of the attenuation elements connected to the up/down counter to receive one of the outputs of the up/down counter for switching control; and b. a constant-gain amplifier connected to the cascaded attenuation elements to receive an attenuated test signal and produce the amplified test signal.

5. The apparatus of claim 1 wherein the gain-control means comprises:

a. an AGC amplifier; and b. an amplifier of fixed gain connected in cascade with the AGC amplifier.

6. The apparatus of claim 5 wherein the level controller comprises:

a. a first detector and filter connected to the AGC amplifier to receive the output of the AGC amplifier and produce a first detected signal;

b. a first comparator connected to the first detector and filter and to a first reference source to compare the first detected signal with the first reference source to produce a first compared signal;

c. a second detector and filter connected to the amplifier of fixed gain to receive the output of the amplifier and produce a second detector signal;

d. a second comparator connected to the second detector and filter and to a second reference source to compare the second detected signal with the second reference source to produce a second compared signal;

e. a logic unit and clock connected to the first and second comparators to produce control signals in response to the first and second compared signals;

f. a shift register connected to the logic unit and clock to shift in response to the control signals to produce a shift output; and g. a plurality of resistors connected to the shift register and the AGC amplifier to control gain of the AGC amplifier in response to the shift output.

* * * * *